US006233263B1

(12) United States Patent
Chang-Hasnain et al.

(10) Patent No.: US 6,233,263 B1
(45) Date of Patent: May 15, 2001

(54) MONITORING AND CONTROL ASSEMBLY FOR WAVELENGTH STABILIZED OPTICAL SYSTEM

(75) Inventors: Constance J. Chang-Hasnain, Union City; Renato Dato, Pleasanton; Peter Kner, Oakland; Gabriel S. Li, Emeryville; Philip Worland; Rang-Chen Yu, both of San Jose; Wupen Yuen, Stanford, all of CA (US)

(73) Assignee: Bandwidth9, Fremont, CA (US)

( * ) Notice: Subject to any disclaimer, the term of this patent is extended or adjusted under 35 U.S.C. 154(b) by 0 days.

(21) Appl. No.: 09/326,126

(22) Filed: Jun. 4, 1999

(51) Int. Cl.$^7$ .................................................. H01S 3/13
(52) U.S. Cl. .............................. 372/32; 372/20; 372/29; 372/9
(58) Field of Search .................................. 372/32, 28, 26, 372/9, 33, 20, 23, 29, 38

(56) References Cited

U.S. PATENT DOCUMENTS

| H147      | 11/1986 | Feldman et al.         | 357/47  |
|-----------|---------|------------------------|---------|
| 4,244,045 | 1/1981  | Nosu et al.            | 370/3   |
| 4,493,113 | 1/1985  | Forrest et al.         | 455/606 |
| 4,577,009 | 3/1986  | Forrest et al.         | 357/30  |
| 4,577,207 | 3/1986  | Copeland               | 357/17  |
| 4,595,454 | 6/1986  | Dautermont-Smith et al.| 156/647 |
| 4,605,942 | 8/1986  | Camlibel et al.        | 357/17  |
| 4,660,208 | 4/1987  | Johnston, Jr. et al.   | 372/46  |
| 4,700,210 | 10/1987 | Burton et al.          | 357/17  |
| 4,709,413 | 11/1987 | Forrest et al.         | 455/606 |

(List continued on next page.)

FOREIGN PATENT DOCUMENTS

| 0 421 674 A2 | 4/1991  | (EP) | H02S/3/096 |
|--------------|---------|------|------------|
| 0 570 243 A1 | 11/1993 | (EP) | H01S/3/139 |
| 0 786 838 A2 | 7/1997  | (EP) | H01S/3/025 |
| 0 818 857 A1 | 1/1998  | (EP) | H01S/1/00  |
| 0 818 859 A1 | 1/1998  | (EP) | H01S/3/133 |
| 0 829 934 A1 | 3/1998  | (EP) | H01S/3/085 |
| 0 911 621 A2 | 4/1999  | (EP) | G01J/9/00  |
| WO 97/05679  | 2/1997  | (WO) | H01S/3/13  |

OTHER PUBLICATIONS

Mikio, Y., "Circuit for Stabilizing Oscillating Wavelength of Laser Diode", Patent Abstracts of Japan, vol. 014, No. 163, Mar. 29, 1990, (JP02020084).

Ishii, H. et al., "Wavelength stabilisation of a three–electrode distributed Bragg reflector laser with longitudinal mode control", Electronics Letters, vol. 33, No. 6, Mar. 13, 1997, pp. 494–496.

Goldstein, L. et al., "Metamorphic GaAs/AIAs Bragg deposited on InP for 1,3/1,55$\mu$m vertical cavity lasers" Centre D'Elaboration Des Materiaux Et D'Etudes Structurales.

Lambert, B. et al., High Reflectivity 1.55$\mu$m (Al) GaAsSb/ AlAsSb Bragg Reactor Lattice Matched on InP Substrates; France Telecom CNET Lab/Rio ; Jul. 19, 1994.

Anan, T. et al., Improved Reflectivity of AlPSb/GaPSb Bragg Reflector for 1.55$\mu$m Wavelength; Electronics Letters; Dec. 8, 1994, vol. 30, No. 25.

Blum, O. et al., Digital Alloy AlAsSb/AlGaAsSb Distributed Bragg Reflectors Lattice Matched to InP For 1.3— 1.55$\mu$m Wavelength Range; Electronics Letters; Jul. 20, 1995, vol. 31, No. 15.

*Primary Examiner*—Leon Scott, Jr.
(74) *Attorney, Agent, or Firm*—Wilson Sonsini Goodrich & Rosati

(57) ABSTRACT

A monitoring and control assembly for an optical system includes a tunable laser. The laser generates a divergent output beam along an optical axis. A first photodetector is provided. A wavelength selective filter is tilted at an angle relative to the optical axis that provides an angular dependence of a wavelength reflection of the wavelength selective filter and directs the reflected output beam towards the first photodetector.

34 Claims, 12 Drawing Sheets

U.S. PATENT DOCUMENTS

| | | | |
|---|---|---|---|
| 4,756,590 | 7/1988 | Forrest et al. | 350/96.15 |
| 4,768,070 | 8/1988 | Takizawa et al. | 357/17 |
| 4,774,554 | 9/1988 | Dentai et al. | 357/17 |
| 4,824,200 | 4/1989 | Isono et al. | 350/96.16 |
| 4,843,280 | 6/1989 | Lumbard et al. | 313/500 |
| 4,888,624 | 12/1989 | Johnston, Jr. et al. | 357/16 |
| 4,949,350 | 8/1990 | Jewell et al. | 372/45 |
| 4,991,179 | 2/1991 | Deppe et al. | 372/45 |
| 4,999,315 | 3/1991 | Johnston, Jr. et al. | 439/94 |
| 4,999,842 | 3/1991 | Huang et al. | 372/45 |
| 4,999,843 | 3/1991 | Luryi et al. | 372/45 |
| 5,005,935 | 4/1991 | Kunikane et al. | 350/96.16 |
| 5,018,157 | 5/1991 | Deppe et al. | 372/45 |
| 5,034,344 | 7/1991 | Jewell et al. | 437/129 |
| 5,034,958 | 7/1991 | Kwon et al. | 372/45 |
| 5,063,569 | 11/1991 | Xie | 372/45 |
| 5,068,868 | 11/1991 | Deppe et al. | 372/45 |
| 5,073,041 | 12/1991 | Rastani | 385/33 |
| 5,101,460 | 3/1992 | Richard | 385/37 |
| 5,102,812 | 4/1992 | Caneau et al. | 437/32 |
| 5,104,824 | 4/1992 | Clausen et al. | 437/90 |
| 5,115,441 | 5/1992 | Kopf et al. | 372/45 |
| 5,135,605 | 8/1992 | Blonder et al. | 156/628 |
| 5,136,603 | 8/1992 | Hasnain et al. | 372/50 |
| 5,146,078 | 9/1992 | Luryi | 250/213 |
| 5,158,908 | 10/1992 | Blonder et al. | 437/129 |
| 5,164,949 | 11/1992 | Ackley et al. | 372/45 |
| 5,170,407 | 12/1992 | Schubert et al. | 372/96 |
| 5,171,704 | 12/1992 | Abernathy et al. | 437/81 |
| 5,182,787 | 1/1993 | Blonder et al. | 385/131 |
| 5,206,526 | 4/1993 | Liu et al. | 257/185 |
| 5,206,871 | 4/1993 | Deppe et al. | 372/45 |
| 5,206,872 | 4/1993 | Jewell et al. | 372/46 |
| 5,212,701 | 5/1993 | Choquette et al. | 372/45 |
| 5,212,702 | 5/1993 | Choquette | 372/45 |
| 5,214,838 | 6/1993 | Cho et al. | 437/105 |
| 5,216,686 | 6/1993 | Holm et al. | 372/45 |
| 5,216,727 | 6/1993 | Vakhshoori et al. | 385/14 |
| 5,223,723 | 6/1993 | Luryi | 257/184 |
| 5,226,053 | 7/1993 | Cho et al. | 372/45 |
| 5,227,006 | 7/1993 | Abernathy et al. | 156/613 |
| 5,244,749 | 9/1993 | Bean et al. | 428/620 |
| 5,257,648 | 11/1993 | Woo | 257/185 |
| 5,258,316 | 11/1993 | Ackley et al. | 437/24 |
| 5,262,360 | 11/1993 | Holonyak, Jr. et al. | 437/237 |
| 5,281,542 | 1/1994 | Hui et al. | 437/2 |
| 5,288,657 | 2/1994 | Feygenson et al. | 437/90 |
| 5,291,502 | 3/1994 | Pezeshki et al. | 372/20 |
| 5,311,526 | 5/1994 | Gorfinkel et al. | 372/26 |
| 5,316,968 | 5/1994 | Choquette | 437/105 |
| 5,317,587 | 5/1994 | Ackley et al. | 372/45 |
| 5,323,416 | 6/1994 | Bhat et al. | 372/99 |
| 5,328,854 | 7/1994 | Vakhshoori et al. | 437/24 |
| 5,331,658 | 7/1994 | Shieh et al. | 372/50 |
| 5,337,327 | 8/1994 | Ackley | 372/45 |
| 5,343,490 | 8/1994 | McCall | 372/94 |
| 5,348,912 | 9/1994 | Choquette et al. | 437/129 |
| 5,351,257 | 9/1994 | Lebby et al. | 372/48 |
| 5,351,261 | 9/1994 | Lanzerotti et al. | 372/98 |
| 5,351,262 | 9/1994 | Poguntke et al. | 372/102 |
| 5,355,385 | 10/1994 | Amano et al. | 372/49 |
| 5,362,977 | 11/1994 | Hunt et al. | 257/98 |
| 5,387,543 | 2/1995 | Ackley | 437/129 |
| 5,418,183 | 5/1995 | Joyner et al. | 437/129 |
| 5,446,752 | 8/1995 | Ackley et al. | 372/46 |
| 5,457,760 | 10/1995 | Mizrahi | 385/37 |
| 5,493,577 | 2/1996 | Choquette et al. | 372/46 |
| 5,495,360 | 2/1996 | Yoo | 359/248 |
| 5,498,883 | 3/1996 | Lebby et al. | 257/95 |
| 5,574,744 | 11/1996 | Gaw et al. | 372/50 |
| 5,598,040 * | 1/1997 | Markis | 372/26 |
| 5,614,436 | 3/1997 | Shim et al. | 437/129 |
| 5,619,609 | 4/1997 | Pan et al. | 385/136 |
| 5,629,951 | 5/1997 | Chang-Hasnain et al. | 372/20 |
| 5,638,392 | 6/1997 | Ramdani et al. | 372/45 |
| 5,659,640 | 8/1997 | Joyner | 385/14 |
| 5,661,075 | 8/1997 | Grodzinski et al. | 438/32 |
| 5,677,924 | 10/1997 | Bestwick | 372/96 |
| 5,696,023 | 12/1997 | Holonyak et al. | 437/133 |
| 5,719,891 | 2/1998 | Jewell | 372/45 |
| 5,719,893 | 2/1998 | Jiang et al. | 372/45 |
| 5,737,104 | 4/1998 | Lee et al. | 359/124 |
| 5,742,630 | 4/1998 | Jiang et al. | 372/50 |
| 5,748,350 | 5/1998 | Pan et al. | 359/130 |
| 5,751,757 | 5/1998 | Jiang et al. | 372/50 |
| 5,757,836 | 5/1998 | Jiang et al. | 372/50 |
| 5,760,419 | 6/1998 | Nabiev et al. | 357/12 |
| 5,764,671 | 6/1998 | Lebby et al. | 372/45 |
| 5,764,679 | 6/1998 | Shen et al. | 372/69 |
| 5,771,253 | 6/1998 | Chang-Hasnain et al. | 372/20 |
| 5,805,624 | 9/1998 | Yang et al. | 372/45 |
| 5,812,577 | 9/1998 | Dawson et al. | 372/46 |
| 5,825,792 * | 10/1998 | Villeneuve et al. | 372/32 |
| 5,903,586 | 5/1999 | Ramdani et al. | 372/45 |
| 5,978,408 | 11/1999 | Thornton | 372/96 |

* cited by examiner

MONITORING AND CONTROL ASSEMBLY FOR WAVELENGTH STABILIZED OPTICAL SYSTEM

BACKGROUND OF THE INVENTION

1. Field of the Invention

This invention relates generally to a monitoring and control assembly for an optical system, and more particularly to a monitoring and control assembly for a laser system.

2. Description of Related Art

Optical fiber communication systems provide for low loss and very high information carrying capacity. In practice, the bandwidth of optical fiber may be utilized by transmitting many distinct channels simultaneously using different carrier wavelengths. The associated technology is called wavelength division multiplexing (WDM). In a narrow band WDM system 8, 16 or more different wavelengths are closely spaced to increase fiber transmission capacity.

The wavelength bandwidth that any individual channel occupies depends on a number of factors, including the impressed information bandwidth, and margins to accommodate for carrier frequency drift, carrier frequency uncertainty, and to reduce possible inter-channel cross-talk due to non-ideal filters.

To maximize the number of channels, lasers with stable and precise wavelength control are required to provide narrowly spaced, multiple wavelengths. Some laser sources, for example distributed feedback (DFB) lasers, exhibit wavelength drift over time, in excess of the requirements for narrow band WDM. The wavelength of the device tends to change with aging under continuous power. Since telecommunication systems are expected to have a lifetime of the order of 25 years, wavelength control must be added to the laser transmitter to ensure minimum cross-talk between narrowly spaced channels over extended time periods.

Single wavelength optical communications systems are widely used in the industry. Ideally, systems designers seek minimum disruption of existing systems and compatibility with existing packaging in development of WDM systems.

Typically, known laser wavelength monitoring and stabilization systems are based on a unit external to the standard package of a laser source (transmitter). One commercially available system for monitoring and control of the wavelength of a semiconductor laser is an assembly based on crystal gratings. For example, in a known system manufactured by Accuwave, and described in the product literature, a wavelength locker unit is provided which comprises a lithium niobate crystal in which two Bragg gratings are written, illuminated by a collimated beam from a laser source coupled to the assembly, and two photodetectors. Each grating has a slightly different Bragg wavelength and angle relative to the input beam. The output reflected from the gratings is directed to the two detectors and the differential output is used to provide feedback control to the laser. Wavelength stability of better than 10 pm can be achieved with the control loop. However, the locker utilizes a separate unit from the transmitter, and thus requires external coupling to the laser or light source. Moreover, the unit is designed for a specific wavelength, as specified by the grating parameters. Different units are required for different wavelengths.

Another known type of wavelength monitoring/control assembly is based on a fiber grating. For example, GB Patent Application No. 96/00478 filed Mar. 4, 1996 to Epworth et al., relates to an external cavity type laser whose external reflector is provided by a Bragg reflector located in an optical fibre butted to an anti-reflection coated facet of the semiconductor laser. The grating is placed far enough from the laser that the longitudinal modes are so closely spaced that the laser operates multimode with so many modes as to make mode partition noise negligible. Another GB Patent Application No. 95/19614.3, filed Sep. 26, 1995 to Epworth et al., relates to using a chirped fiber grating for equalization and laser frequency stabilization.

Another system for stabilization of a semiconductor laser is described in U.S. Pat. No. 4,309,671 to Malyon which uses a pair of matched photodiodes and two beam splitters. The first beam splitter and first photodiode monitor power, and a second beam splitter, a frequency dependent filter and second photodiode are used to monitor wavelength changes. The outputs of the matched photodiodes are fed via amplifiers to a subtractor amplifier and the output is fed as negative feedback to the amplifier controlling operation of the laser.

Other known systems are based on a filter element such as a Fabry-Perot etalon. For example, U.S. Pat. No. 5,331,651 to Becker et al. describes the use of a Fabry-Perot etalon for fine tuning in conjunction with a grating for coarse tuning of the output of a laser.

In a system described in U.S. Pat. No. 5,438,579 to Eda et al., a Fabry-Perot etalon is used with a single photodetector to generate a signal used to lock onto one peak of a semiconductor laser, requiring collimated beams. Hill et al., in U.S. Pat. No. 4,839,614 describe a system for referencing frequencies of radiation from multiple sources relative to a reference source, using a filter element such as a Fabry-Perot etalon and a corresponding plurality of detectors.

Another system for laser wavelength stabilization is described in U.S. Pat. No. 4,914,662 to Nakatani et al. which involves spectroscopically processing the output of a variable wavelength laser and measuring a spatial distribution using image processing apparatus, and then comparing the distribution to that of a reference light source of fixed wavelength. The latter image processing system is complex, and not readily compatible with providing a low cost, compact unit.

Japanese Patent Application 92-157780 relates to a frequency stabilizer for semiconductor laser, without using external modulating means, and is based on an inclined Fabry-Perot etalon on which the laser source is incident, and two photo-detectors to detect respectively the transmitted and reflected signals. By subtracting outputs of the two detectors, a signal is provided for controlling the oscillation frequency. Resonator length is altered by changing the inclination of the etalon to allow for tunability. The implementation of this system for minimum space requires using the FP at a relatively large angle, with decreased stability in terms of center wavelength and bandwidth. On the other hand, a small FP angle requires added components and space, as shown in FIG. 1B of this patent application. Also, independent detectors are used, with potentially different response and aging characteristics.

Consequently, various existing systems for wavelength stabilization are known using a crystal grating, fiber grating or etalon based arrangement. The grating based systems lack wavelength tunability and many systems are based on relatively large control units external to a packaged laser source, with concurrent coupling, space and power dissipation problems. While etalon based systems provide tunability, none of the known configurations are sufficiently compact to incorporate in known standard packages without disruption.

There is a need for a monitoring and control assembly for an optical system that is more compact in design, more robust, lower cost and has a higher level of integration.

SUMMARY OF THE INVENTION

Accordingly, an object of the present invention is to provide a monitoring and control assembly for an optical system.

Another object of the present invention is to provide a compact monitoring and control assembly for an optical system.

A further object of the present invention is to provide a monitoring and control assembly for a laser system.

Still another object of the present invention is to provide a monitoring and control assembly for a diode laser system.

Yet another object of the present invention is to provide a monitoring and control assembly for a VCSEL laser system.

Another object of the present invention is to provide a monitoring and control assembly for a tunable laser system.

These and other objects of the present invention are achieved in a monitoring and control assembly for an optical system that includes a tunable laser. The laser generates a divergent output beam along an optical axis. A first photodetector is provided. A wavelength selective filter is tilted at an angle relative to the optical axis that provides an angular dependence of a wavelength reflection of the wavelength selective filter and directs the reflected output beam towards the first photodetector.

In another embodiment, a monitoring and control assembly for an optical system includes a tunable laser that generates a divergent output beam along an optical axis. A collimating optical element is positioned along the optical axis. A pair of photodetectors are provided. A wavelength selective filter includes a Fabry-Perot Etalon with a distributed thickness to provide a positional dependence of a wavelength reflection or transmission of the filter and transmits or reflects the beam towards the pair of detectors.

DETAILED DESCRIPTION

Figure 1:
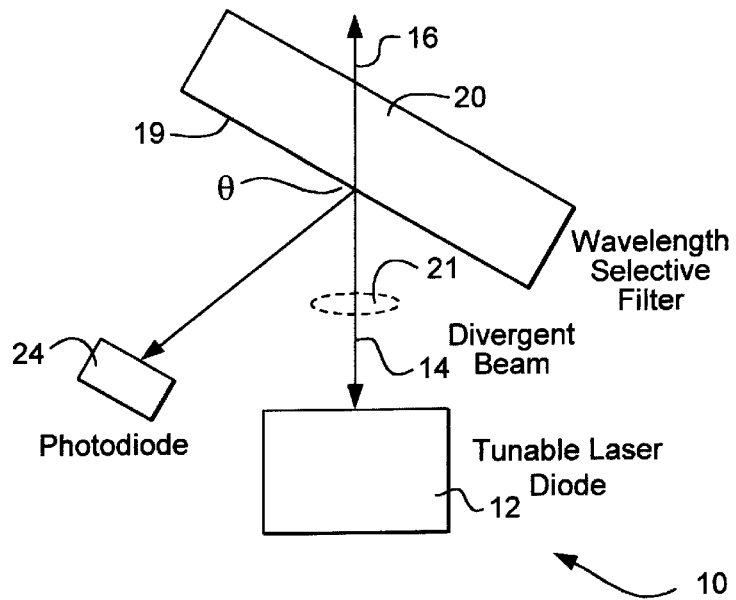
FIG. 1 is a schematic diagram of one embodiment of a monitoring and control assembly for an optical system of the present invention with a wavelength selective filter positioned at an angle relative to an output face of a laser.
Figure 2:
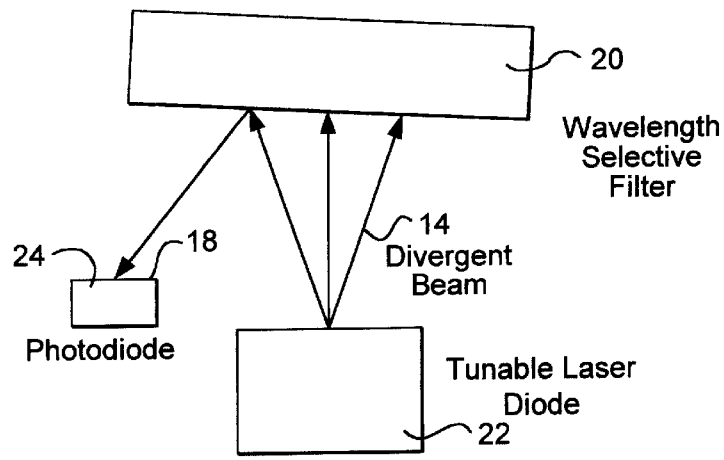
FIG. 2 is a schematic diagram of the assembly of FIG. 1 illustrating a change of the angle of the wavelength selective filter relative to the output face of the laser.

Referring now to FIGS. 1 and 2, one embodiment of a monitoring and control assembly 10 for an optical system includes a tunable laser 12 that generates a divergent output beam 14 along an optical axis 16. Laser 12 can be any single mode semiconductor diode laser. Preferably, laser 12 is a vertical cavity surface emitting laser (VCSEL) or output facet of a single mode fiber (SMF). Output beam 14 is preferably utilized for communication applications, with a wavelength in the range of 800 nm to 1650 nm.

Also included is one or more photodetectors 24. Photodetector 24 can be an avalanche photodiode, a PIN photodiode, a metal-semiconductor-metal detector, and the like. Preferably, photodetector 24 is a PIN photodiode. Photodetector 24 converts optical energy into an electric current. Changes in electric current are used for monitoring and control of laser 12. Two or more photodetectors may be employed. In one embodiment, an array of photodetectors 24 is utilized. More than one photodiode 24 can be used greater discrimination in monitoring and control of laser 12, as more fully described hereafter.

Positioned along optical axis 16 is a wavelength selective filter 20. Suitable wavelength selective filters 20 include but are not limited to a Bragg grading, multilayer-thin-film filter or solid Fabry-Perot etalon. Preferably wavelength selective filter 20 is a Fabry-Perot etalon or a multilayer-tnin-film filter. Wavelength selective filter 20 can be tilted at an angle θ relative to optical axis 16 to provide an angular dependence of a wavelength reflection of wavelength selective filter 20 and direct the reflected output beam 14 towards photodetector 24. FIG. 2 illustrates a change in angle θ. Wavelength selective filter 20 is distanced from laser 12 and tilted at the angle θ relative to optical axis 16 in order to provide an angular dependence of wavelength reflection from wavelength selective filter 20. Wavelength selective filter 20 directs the reflected output beam 14 in a direction towards photodetector 24.

Wavelength selective filter 20 splits incident output beam 14 into a transmitted portion and a reflected portion. The ratio of the transmitted and reflected portions is a function of wavelength of output beam 14 and the angle θ that is defined by an incident face 19 of wavelength selective filter 20 relative to the incident beam.

In FIG. 1, one photodetector 24 is illustrated. Received power by photodetector 24 is a function of wavelength. When the wavelength of output beam 14 changes, there is change in received power by photodetector 24. When the total output power of output beam 14 is a constant, any change in received power at photodetector 24 is used as an indication that there has been a change in the wavelength of laser 12.

When wavelength selective filter 20 reflects a portion of output beam 14 to photodetector 24, the result is a compact assembly that can be an integral unit. This creates a folded back geometry of output beam 14 with a reduction size of monitoring and control assembly 10. In comparison, when wavelength selective filter 20 is in a transmitting mode, wavelength selective filter 20 is positioned between laser 12 and photodiode 24. This does not produce the folded back geometry. Additionally, the folded back geometry allows monolithic integration of laser 12 with photodetector 24 on the same chip.

Figure 3:
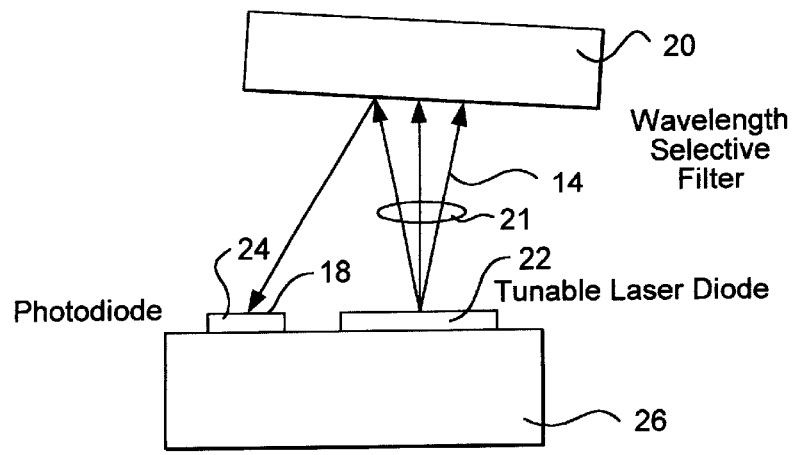
FIG. 3 is a schematic diagram of the assembly of FIG. 1 with the laser and a photodetector positioned on a common substrate.

As illustrated in FIG. 3, laser 12 and photodetector 24 can be positioned on a common substrate. This is particularly advantageous for surface emitting devices. It can be difficult to fabricate in-plane photodetectors 24 with an in-plane diode laser 12 on a common substrate. This problem is alleviated with surface emitting devices. Photodetector 24 is positioned in a lateral direction relative to laser 12. An output face 22 of laser 12 can be parallel to a face 18 of photodetector 24.

The divergence of laser 12 can be controlled by a lens 21 which can be an a spherical lens, a cylindrical lens, a spherical lens, a graded index lens of plastic or glass, and the like. a larger spot size gives wavelength selective filter 20 a shape closer to desired and provides better power transfer to photodetector 24. Alternatively, monitoring and control assembly 10 need not include lens 21 depending on the divergence of laser 12.

For dense WDM applications, where precise wavelengths are required, differential detection scheme is utilized to further enhance accuracy. A differential detection scheme compares the output from a pair of photodetectors 24. When there is an array, there is still a comparison between a pair of adjacent or non-adjacent photodetectors 24, one comparison made at a time. When a pair of photodetectors 24 is used a difference in response of the two photodetectors 24 is used to determine wavelength deviation from a pre-set wavelength.

Usually, output beam 14 is divergent. This divergence is used as an advantage for differential detection schemes. When output beam 14 is divergent there is a range of incident angles $\theta_{min}$ to $\theta_{max}$. on face 19. The larger the divergence, the larger the difference between $\theta_{min}$ and $\theta_{max}$. When laser 12, photodetector 24 and wavelength selective filter 20 are in fixed positions relative to each other, and a beam receiving area of photodetector 24 is small, photodetector 24 only receives the portion of reflected output beam 14 with a particular incident angle $\theta_1$.

Figure 4:
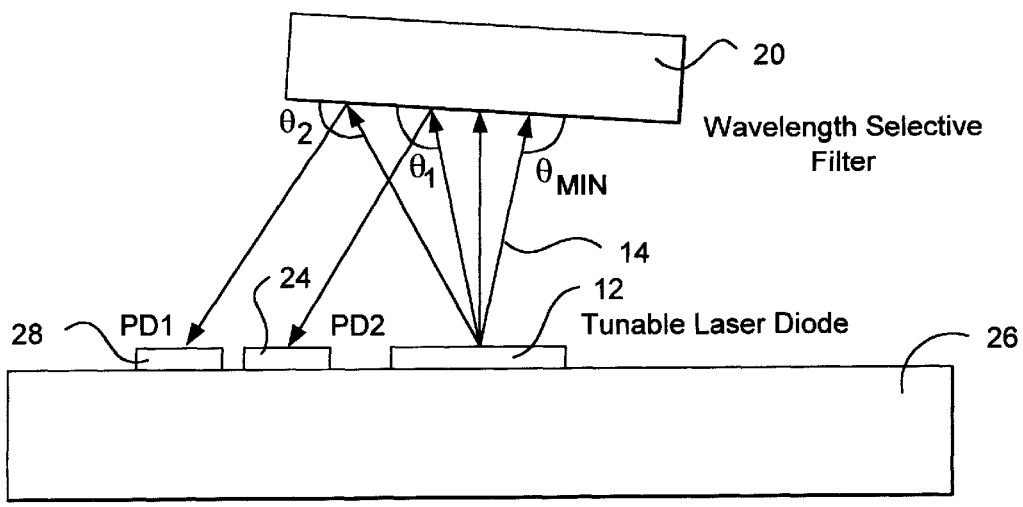
FIG. 4 is a schematic diagram of another embodiment of a monitoring and control assembly for an optical system of the present invention with two photodetectors and a wavelength selective filter positioned at an angle relative to an output face of a laser.

As shown in FIG. 4, a second photodetector 28 can be included and positioned adjacent to photodetector 24. In this embodiment, two different parts of output beam 14 are incident on photodetectors 24 and 26. a change in wavelength from laser 12 is converted to a difference in transmission detected by photodetectors 24 and 28.

Figure 5:
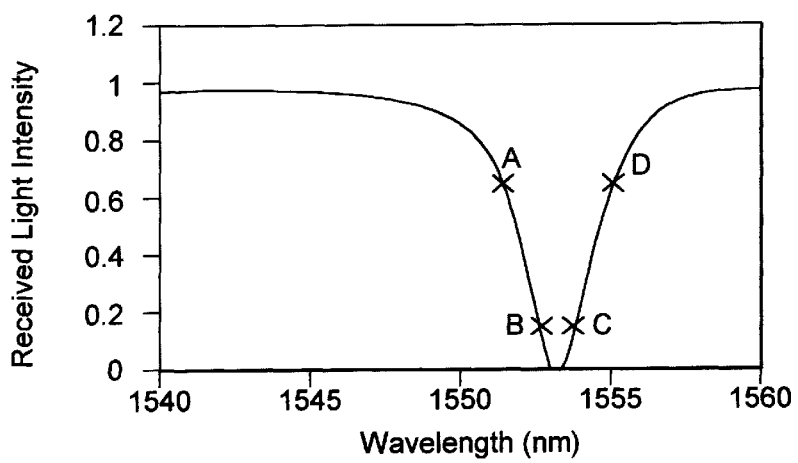
FIG. 5 is a graph illustrating light reflected from the wavelength selective filter and received by the photodetector of FIG. 1 when the wavelength of the light output from the laser changes.

FIG. 5 illustrates in one example of light reflected off wavelength selective element 20 that is received by photodiode 24 when the wavelength of the light output from laser 12 changes. In FIG. 2, a Fabry-Perot etalon is used as wavelength selective filter 20. The sharp changes at the 1552 nm region may be utilized for wavelength change detection between points A–B and C–D shown in FIG. 5.

Referring again to FIG. 4, second photodetector 28 is distanced from first photodetector 28 and receives a different portion of the reflected output beam 14 with a different incident angle $\theta_2$. Because of the difference of the incidence angles, the optical path lengths are different for the two portions of output beam 14 received by the respective photodetectors 18. Therefore, the relationship between the received power at each photodetector 18 verses wavelength is shifted.

Figure 6:
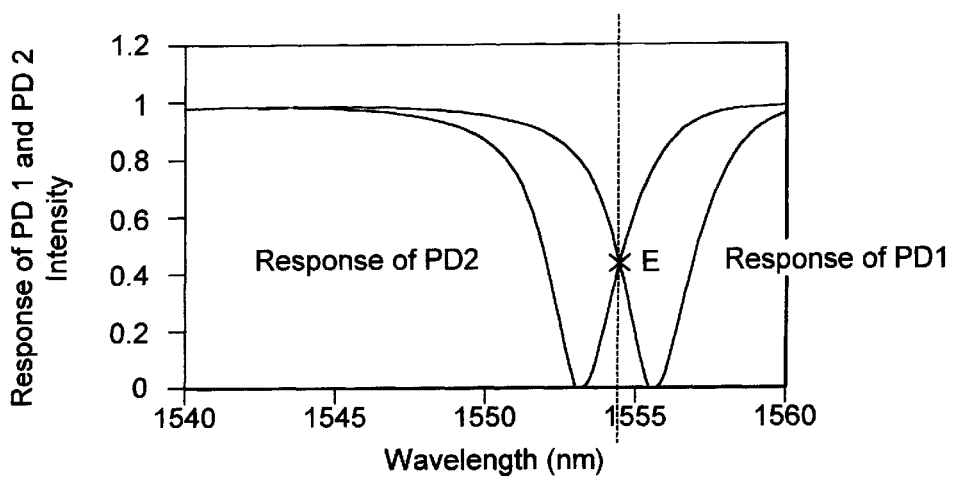
FIG. 6 is a graph illustrating the response expressed as intensity as a function of wavelength of the two photodetectors of FIG. 4.

This shift is determined by the distance between photodetectors 18, their distance from face 19 of wavelength selective filter 20, and the distance between wavelength selective filter 20 to laser 12, as illustrated in FIG. 6. At point E, at which the responses from photodetectors 24 and 28 are equal, this is used in setting up the target wavelengths for wavelength locking purposes. Any deviation from the wavelengths results in a difference in response intensity at the two photodetectors. This difference can be used in a feedback control loop to change the wavelength of laser 12 back to the target wavelength, as described in greater detail hereafter. In WDM applications each communication channel is set at a pre-determined wavelength. The wavelength of each transmitter output should be stabilized to much better than the channel spacing. For example, for 50 GHz channel spacing, the wavelengths should be stabilized to at least 5 GHz.

Figure 7:
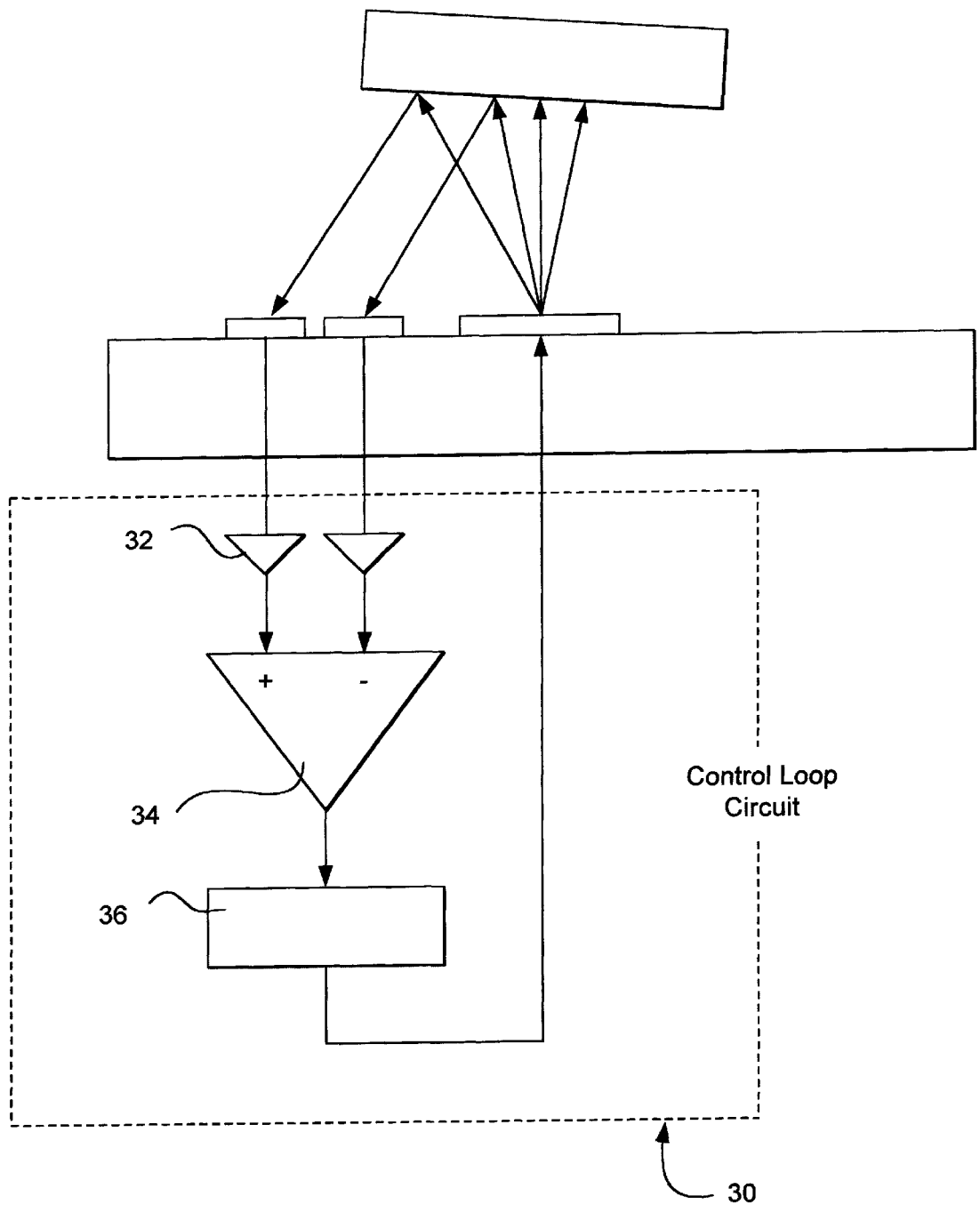
FIG. 7 is a schematic diagram of a control loop circuit in combination with the assembly of FIG. 4.

Referring now to FIG. 7, one embodiment of a control loop circuit, generally denoted as 30, is coupled to photodetectors 24 and 28 and laser 12. Control loop circuit 30 includes a trans impedance amplifier 32, a differential amplifier 34 and an integrator circuit 36. Control loop circuit 30 provides a feedback of a difference signal generated by photodetectors 24 and 28 in response to a change in wavelength of laser 12. Control loop circuit 30 provides wavelength stabilization of the laser in response to a change in wavelength of the laser.

Photodetectors 24 and 28 convert optical energy to a current for a feedback loop for controlling laser 12. The wavelength of laser 12 determines how much of output beam 14 is reflected by wavelength selective filter 20. The signal received by each photodetector 24 and 28 is dependent on the wavelength emitted by laser 12. Because of the angular dependence of wavelength selective filter 20 a wavelength variation from laser 12 is converted to a transmission and reflection change. The wavelength change is detected as a power change. The output signals from photodetectors 24 and 28 are used to generate a difference signal in differential amplifier 34 which is fed to integrator circuit 36 for controlling the output wavelength of laser 12. By arranging that the reflection detected by photodetectors 24 and 28 is the same at a selected wavelength, the difference signal is set to be zero at the predetermined wavelength (the locked wavelength). The locked wavelength can be set with equivalent stability to different values by using unequal gains for photodetectors 24 and 28. If the wavelength of laser 12 changes the differential signal generated by photodetectors 24 and 28, the error signal, is wavelength dependent and is used to monitor the wavelength of laser 12.

Monitoring and control of laser 12 is wavelength tunable by changing the angle of inclination θ of wavelength selective filter 20. Wavelength selective filter 20 can be mounted on an adjustable support with four degrees of freedom. Control loop circuit 30 is dependent on a number of different factors. These factors include, the wavelength selective filter 20 tilt angles in the x and y axis, the wavelength selective filter 20 index change with temperature, the photodetectors 24 and 28 x and y axis offsets and the divergent angle of the incident beam from laser 12.

In various embodiments, laser 12 can be coupled with any number of photodetectors. With a plurality of photodetectors, different pairs of photodetectors can be used for wavelength subsets in a broader wavelength range. Thus, the use of multiple pairs of photodetectors provides coverage for any selected wavelength range. An array of photodetectors can be used. In one embodiment, an array of photodetectors is formed as a monolithically integrated chip and/or an integral assembly. An array has a number of advantages including but not limited to, enhancing flexibility of geometry of monitoring and control assembly 10, providing photodetector redundancy to enhance reliability and lifetime and provides a larger range of wavelengths, for example to cover a broad wavelength range such as 800 nm to 1650 nm. In one embodiment, the array and monitoring and control assembly 10 can be used as a wavelength tuning and locking element.

One embodiment of laser 12 is a VCSEL with a cantilever apparatus that uses an electrostatic force that pulls on a cantilever arm. The mechanical deflection resulting from this electrostatic force is used to change the length of the laser's Fabry-Perot microcavity and consequently to the resonance wavelength.

Figure 8:
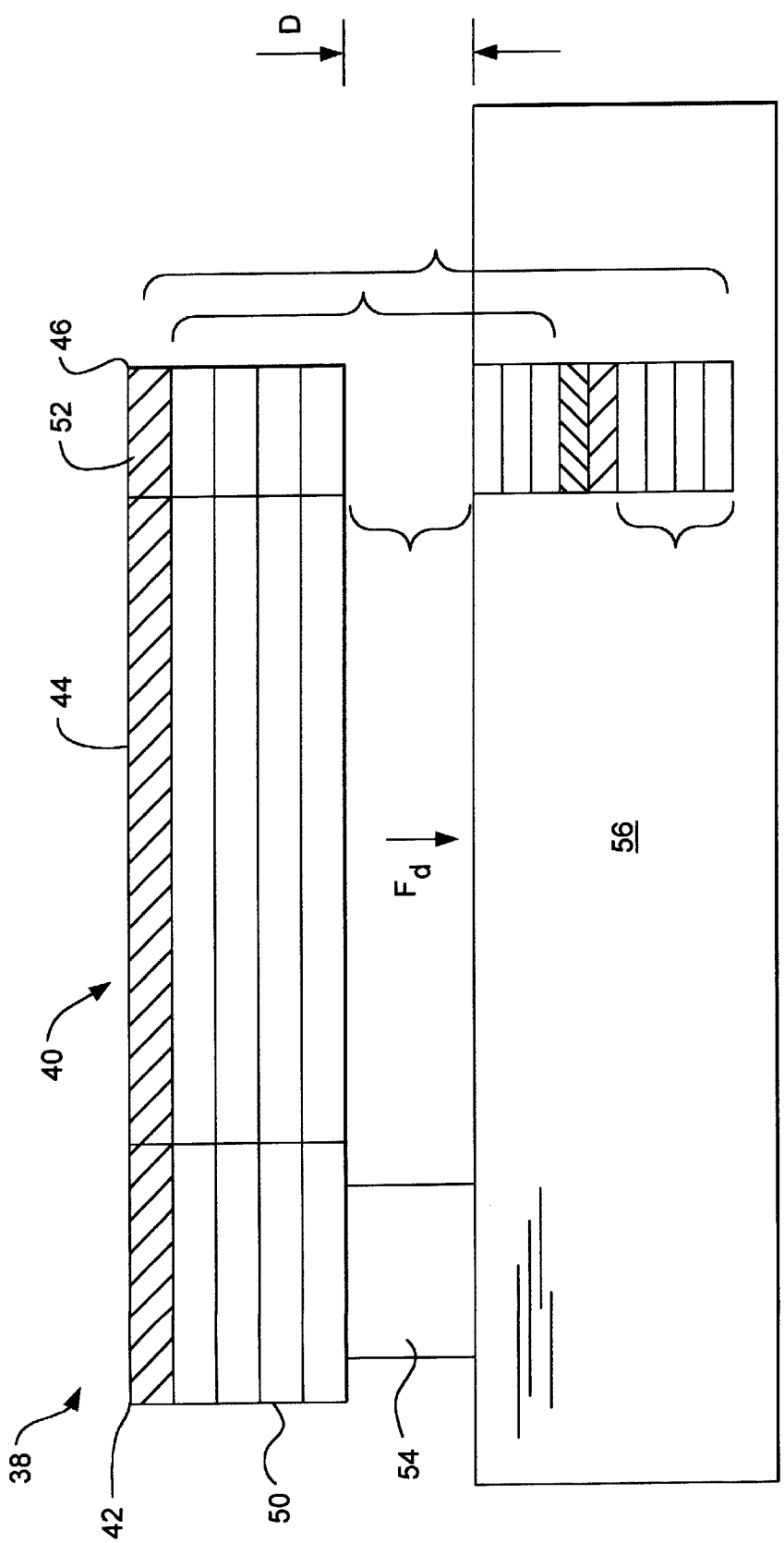
FIG. 8 is a sectional view of a VCSEL laser useful with the assembly of FIG. 4.

Referring now to FIG. 8, cantilever apparatus 38 has a cantilever structure 40 consisting of a base 42, an arm 44 and an active head 46. The bulk of cantilever structure 40 may consist of a plurality of reflective layers 48 which form a distributed Bragg reflector (DBR). Layers can be formed of different materials including but not limited to AlGaAs. Different compositional ratios are used for individual layers 48, e.g., $Al_{0.09}Ga_{0.91}As/Al_{0.58}Ga_{0.42}As$. The topmost layer of layers 48 is heavily doped to ensure good contact with an electrical tuning contact 52 deposited on top of cantilever structure 40.

The actual number of layers 48 may vary from 1 to 20 and more, depending on the desired reflectivity of the DBR. Furthermore, any suitable reflecting material other than AlGaAs may be used to produce layers 48. Active head 46 is made of layers 48. However, arm 44 and base 42 do not need to be made of layers 48.

Base 42 can have a variety of different geometric configurations and large enough to maintain dimensional stability of cantilever structure 38. The width of arm 44 ranges typically from 2 to 8 mu m while its length is 25 to 100 mu m or more. The stiffness of arm 44 increases as its length decreases. Consequently, shorter cantilevers require greater forces to achieve bending but shorter cantilevers also resonate at a higher frequency. The preferred diameter of active head 46 falls between 5 and 40 mu m. Other dimensions are suitable.

Electrical tuning contact 52 resides on all or only a portion of a top of cantilever structure 40. Tuning contact 52 be sufficiently large to allow application of a first tuning voltage $V_{t1}$. Base 54 rests on a substrate 56 across which a voltage can be sustained. Block 54 can be made of the same material as layers 50. a voltage difference between layers 50 and substrate 56 causes a deflection of arm 44 towards substrate 56. If layers 50 and substrate 56 are oppositely doped, then a reverse bias voltage can be established between them. Substrate 56 is sufficiently thick to provide mechanical stability to entire cantilever apparatus 38. Inside substrate 56 and directly under active head 46 are one or more sets of reflective layers with each set forming a second DBR 57. a more complete description of cantilever apparatus 38 is disclosed in U.S. Pat. No. 5,629,951, incorporated herein by reference.

Figure 9:
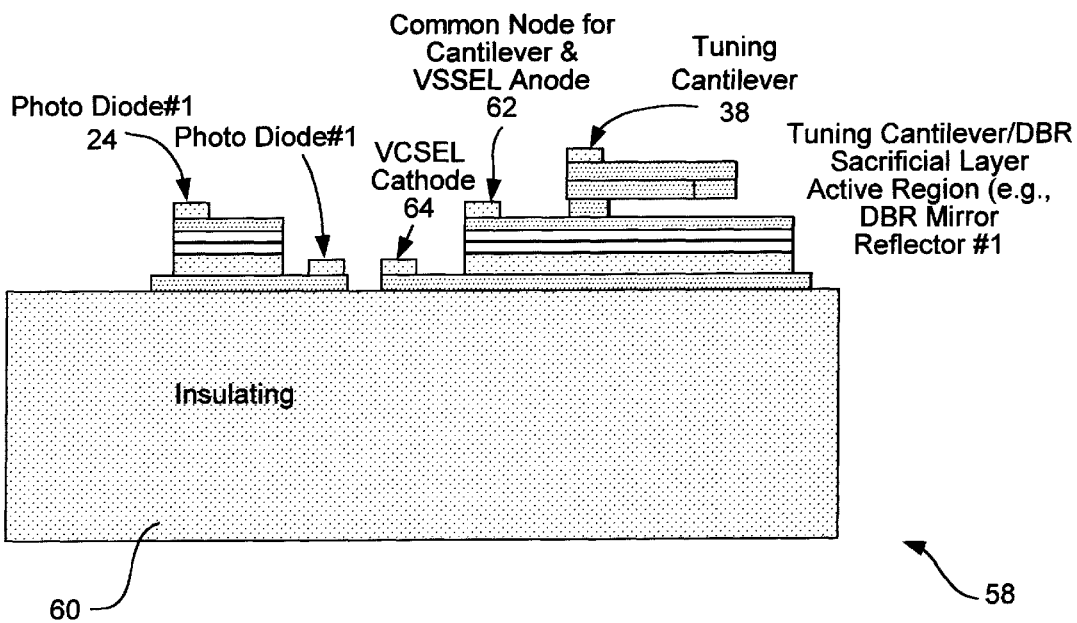
FIG. 9 a sectional view of the VCSEL laser of FIG. 8 and a photodetector which form a monolithically integrated chip.
Figure 10:
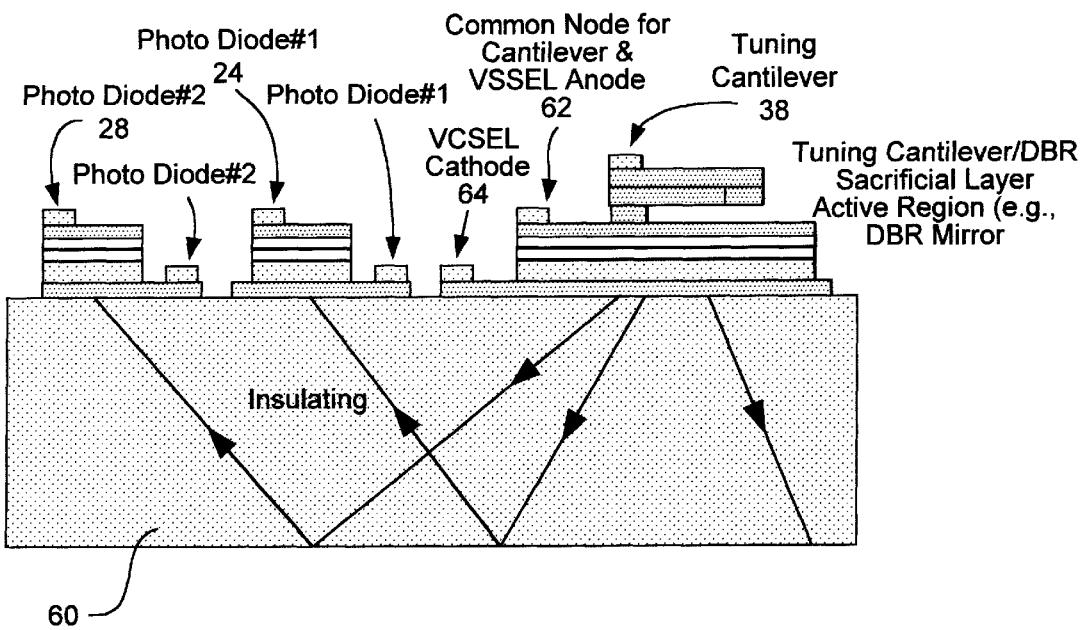
FIG. 10 is a sectional view of the VCSEL laser of FIG. 8 and two photodetectors which form a monolithically integrated chip.

Referring now to FIG. 9, an embodiment of assembly 10 is illustrated with laser 12 and photodiode 24 forming an integrated circuit 58 on an insulator 60. In FIG. 9, laser 12 is shown as being cantilever apparatus 38 of FIG. 8. However, any suitable laser 12 may be utilized to form the integrated circuit. As shown in FIG. 9, integrated circuit includes a common node 62 for a cantilever and VCSEL anode. Also included are a VCSEL cathode 64. More than one photodiode 24 and 28 can be combined with laser 12 to form integrated circuit 58 (FIG. 10). Insulator 60 can have the additional function as being wavelength selective filter 20 as illustrated in FIG. 10 and can also include second DBR 57.

Figure 11:
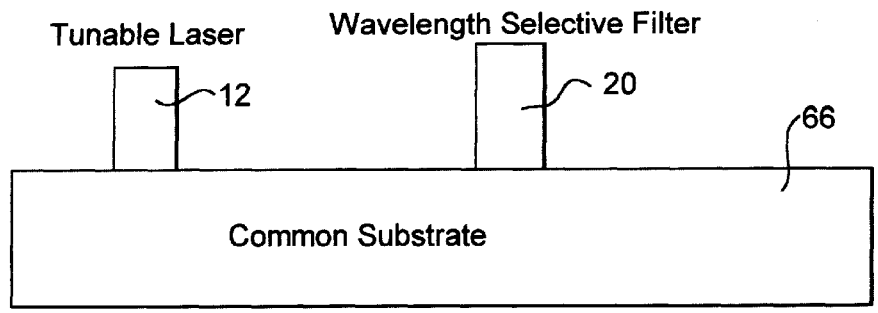
FIG. 11 is a schematic diagram illustrating a laser and a wavelength selective filter of the present invention positioned on a common substrate.

As illustrated in FIG. 11, laser 12 and wavelength selective filter 20 can be positioned on a common substrate 66. This improves ease of assembly and mechanical stability.

Figure 12:
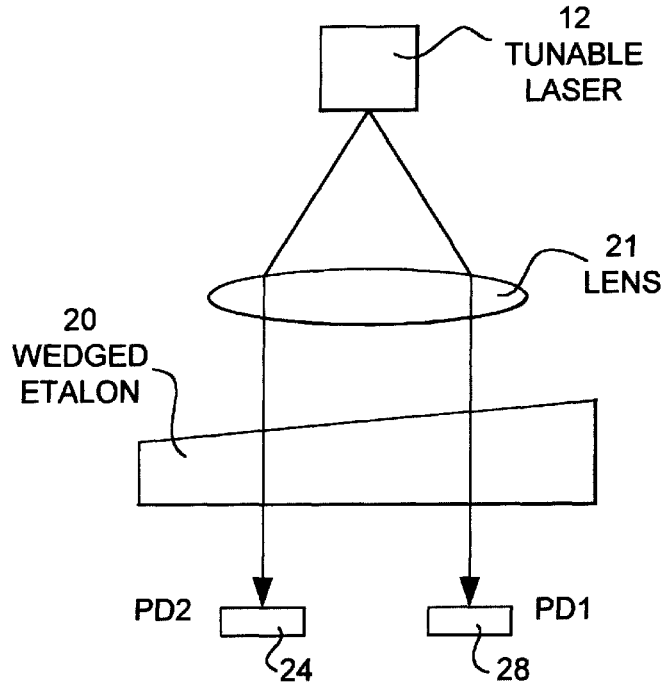
FIG. 12 is a schematic diagram of an embodiment of a monitoring and control assembly for an optical system of the present invention with a wedged wavelength selective filter operating in a transmissive mode.

In another embodiment of the present invention shown in FIG. 12, wavelength selective filter 20 has a wedged shape with a thickness that varies monotonically in a lateral direction. Output beam 14 is collimated by lens 21. Each photodiode 24 and 28 respectively, receives light that corresponds to different positions of wavelength selective filter 20 with a different thickness. With wedged shaped wavelength selective filter 20, each photodiode 24 and 28 has a distinct wavelength dependence. In one embodiment, the wedge angle of wavelength selective filter 20 is determined by a desired capture range. It is preferred that the capture range substantially match the deviation of emitted laser wavelengths from the targeted wavelengths.

Figure 13:
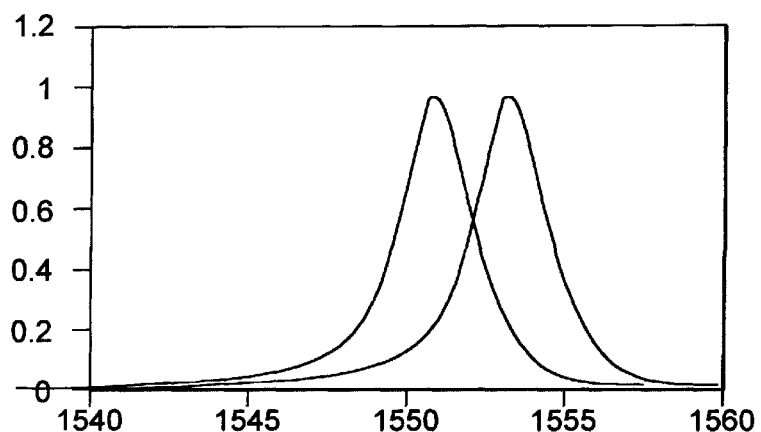
FIG. 13 is a graph illustrating the response of the first and second photodiodes of the assembly of FIG. 12.

Referring to FIG. 13, an example of a resultant response curve vs wavelengths with wavelength selective filter 20 of FIG. 12 is shown. In FIG. 13, the two curves represent the response magnitude of each photodetector 24 and 28 as a function of wavelength.

Figure 14:
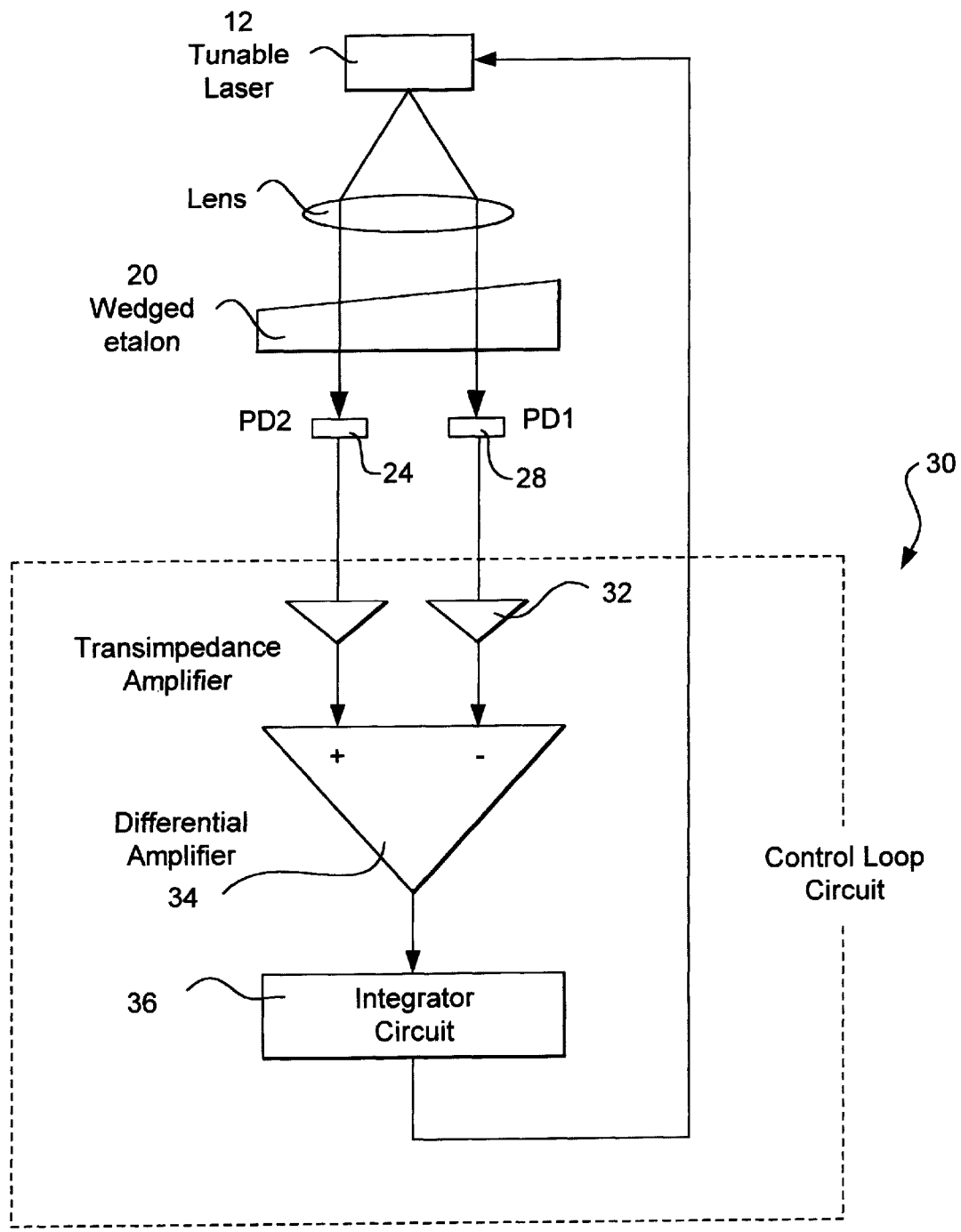
FIG. 14 is a schematic diagram of the assembly of FIG. 12 coupled with a control loop circuit.

Referring now to FIG. 14, control loop circuit 30 can be utilized with the assembly of FIG. 12.

Figure 15:
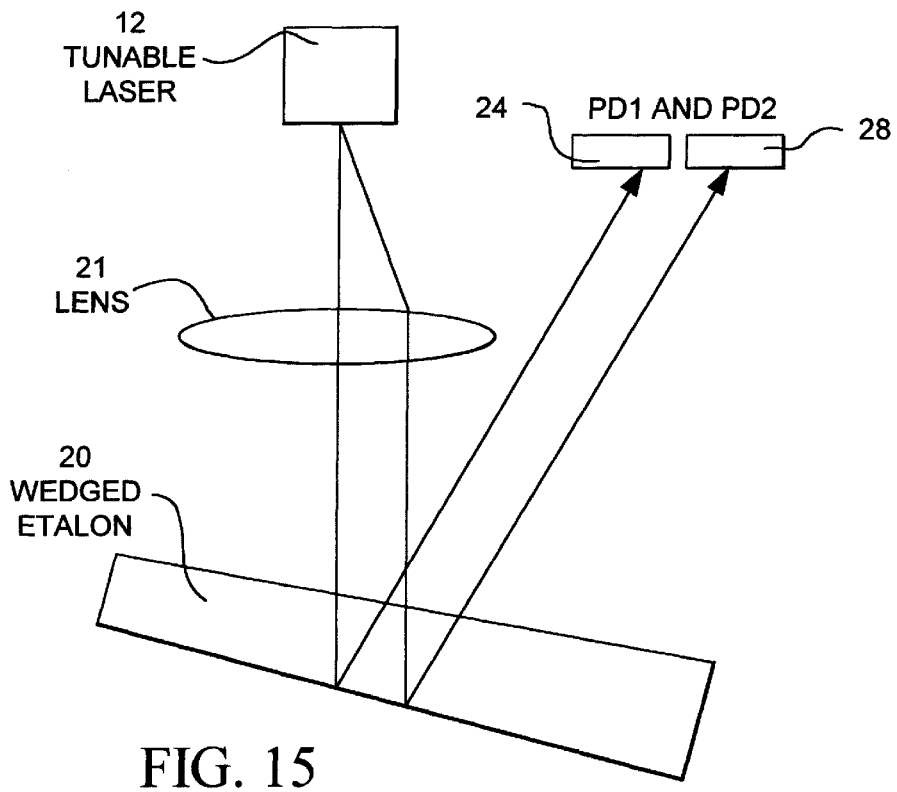
FIG. 15 is a schematic diagram of an embodiment of a monitoring and control assembly for an optical system of the present invention with a wedged wavelength selective filter operating in a reflective mode.
Figure 16:
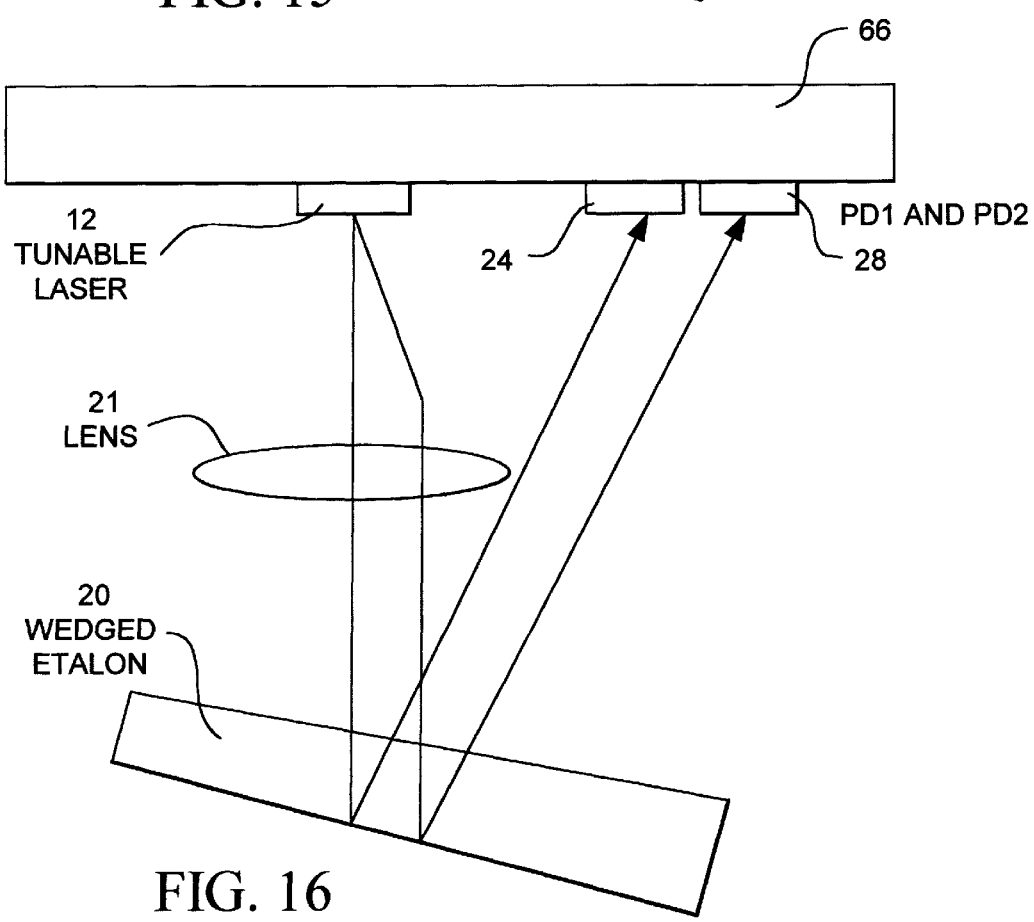
FIG. 16 is a schematic diagram of the assembly of FIG. 15 with the laser and photodiodes positioned on a common substrate.

Wedged selective wavelength filter 20 can be used in the reflective mode as illustrated in FIGS. 15 and 16.

Figure 17:
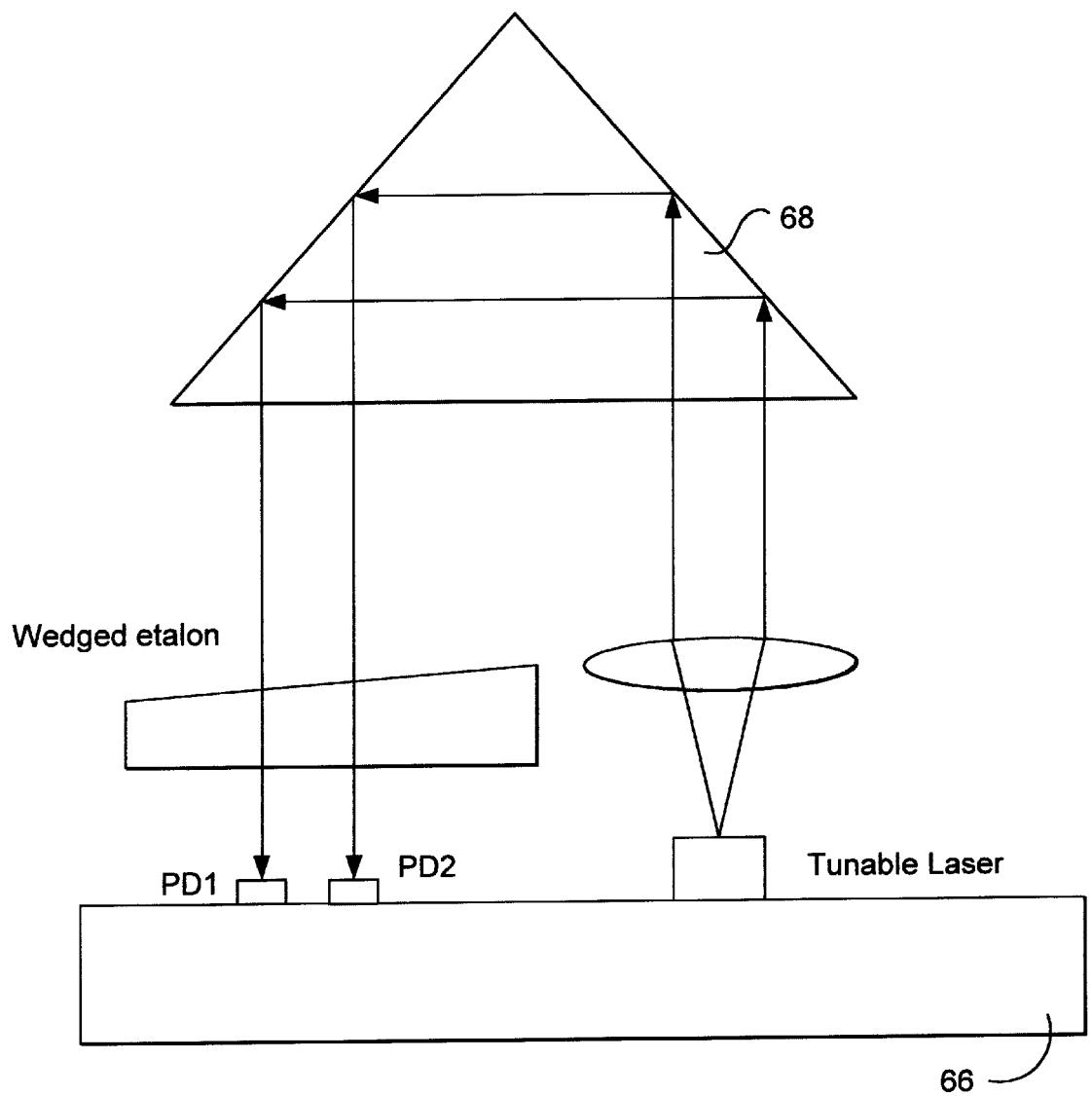
FIG. 17 is a schematic diagram of an embodiment of a monitoring and control assembly for an optical system of the present invention with a wedged wavelength selective filter and a reflective element that collimates the output of the laser.
Figure 18:
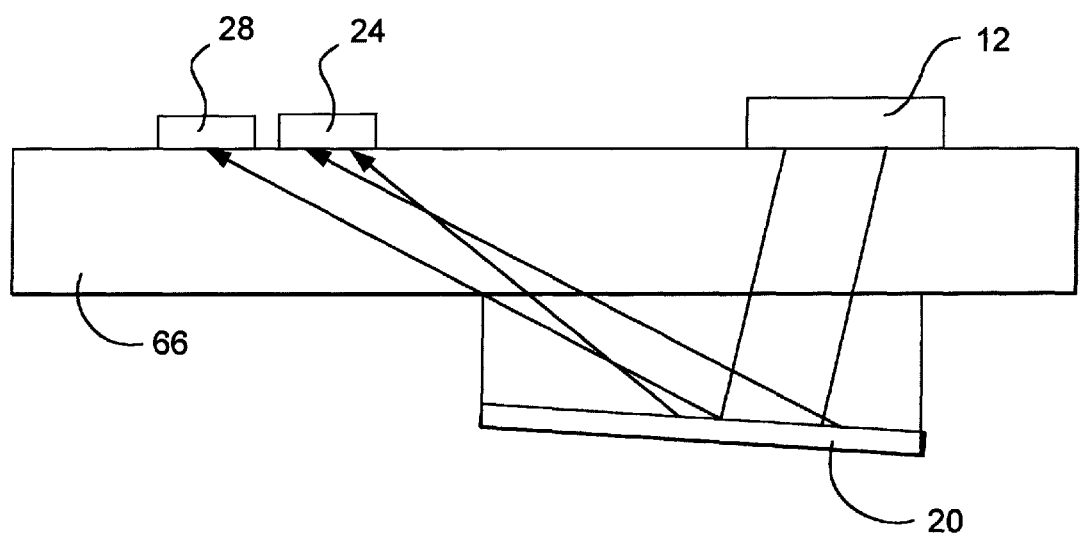
FIG. 18 is a schematic diagram of an embodiment of a monitoring and control assembly for an optical system of the present invention with a wedged wavelength selective filter coupled to the insulator that supports the laser and photodiodes.

In another embodiment shown in FIG. 17, a reflector 68 is used to redirect output beam 14 which is collimated. Reflector 68 can be a prism, hologram, conical reflector, truncated conical reflector, a pair of mirrors and the like. In this embodiment, wedged wavelength selective filter 20 is used in a transmission mode. The embodiment of FIG. 17 provides a folded back geometry of output beam 14 back to common substrate 66 and forms the integrated assembly or a monolithic chip. In FIG. 18, reflector 68 is coupled to wedged wavelength selective filter 20 and thus is also included in common substrate 66. In this embodiment, wedged wavelength selective filter 20 can be glued, epoxied or the like to common substrate 66.

Monitoring and control assembly 10 can be programmable. In WDM applications, a set of discrete wavelengths with equal spacing in frequency is defined as the ITU grid. It is desirable to have a programmable WDM source that can be set to any wavelengths on the ITU grid and stabilized at that wavelength per demand.

Figure 19:
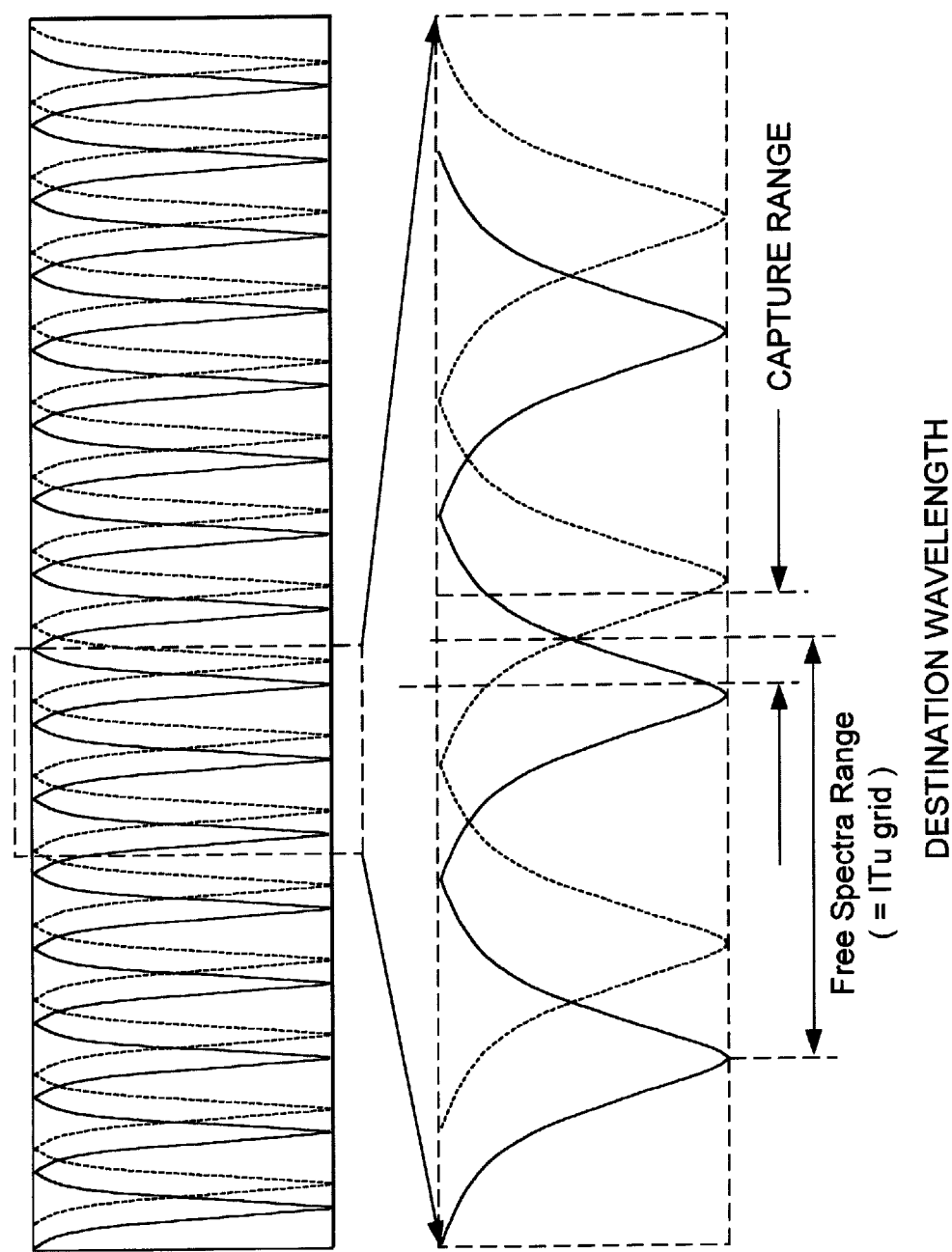
FIG. 19 is a graph illustrating an embodiment of the assembly of the present invention where the free spectra range of the wavelength selective filter coincides with the ITU grid spacing.
Figure 20:
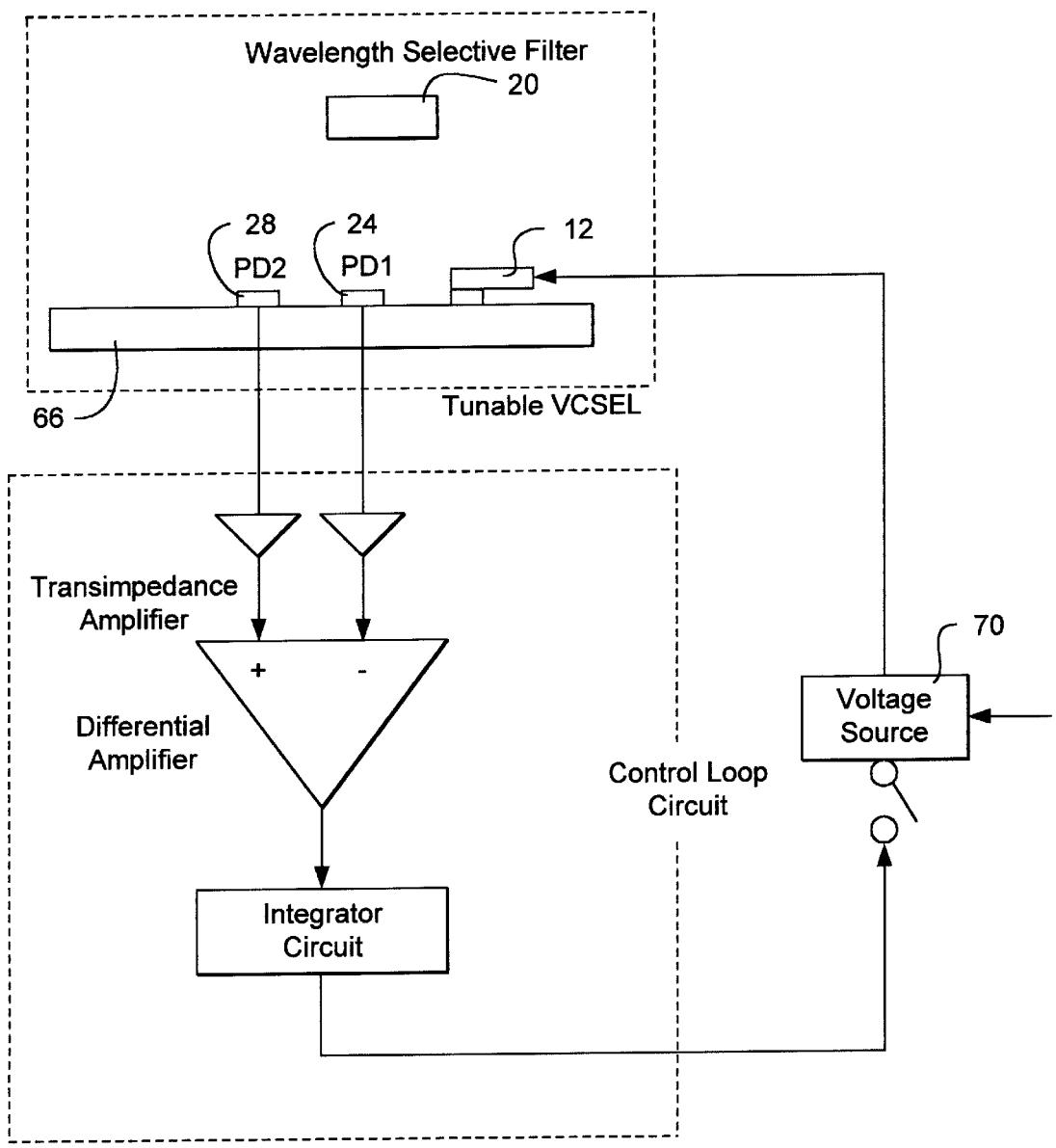
FIG. 20 is a schematic diagram of an embodiment of a monitoring and control assembly for an optical system of the present invention that includes a control loop circuit and is programmable.

In one embodiment, illustrated in FIG. 19, wavelength selective filter 20 can be an etalon with a free spectra range that coincides with the ITU grid spacing. During assembly, the response of photodiodes 24 and 28 is set up such that the locking wavelength coincides with the precise ITU grid wavelength. Monitoring and control assembly 10 can be programmable and tunable with voltage tuning, temperature tuning and current tuning. FIG. 20 illustrates a voltage tuning embodiment with a voltage source 70. The wavelength vs. tuning voltage characteristics of laser 12 are tabulated and saved. In the embodiment of FIG. 20, programmability can be achieved by, (i) disabling control loop circuit 30, (ii) stepping the voltage to the value that corresponds to the destination wavelength which may be saved in a look-up table in a memory chip and (iii) turning on control loop circuit 30.

All embodiments of assembly 10 disclosed herein, can be utilized as an optical multiplexer or de-multiplexer as described in U.S. Patent Applications, identified as Attorney Docket Nos. 21123-705 and 21123-706, filed on the same date as this application, and incorporated herein by reference. The lasers disclosed in U.S. Patent Applications, Attorney Docket Nos. 21123-702 and 21123-703703, filed on the same date as this application, and incorporated herein by reference, can be utilized in all embodiments of assembly 10.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A monitoring and control assembly for an optical system, comprising:
a tunable laser selected from a VCSEL or an edge emitter generating a divergent output beam along an optical axis, the laser including an active region with first and second opposing reflectors that define a laser gain cavity;
a first photodetector positioned outside of the laser gain cavity; and
an adjustable wavelength selective filter that splits the output beam into a transmitted portion and a reflected portion, the adjustable wavelength selective filter being positioned at an angle θ relative to the optical axis to provide an angular dependence of a wavelength reflection of the wavelength selective filter and direct the reflected output beam towards the first photodetector, wherein the wavelength selective filter provides wavelength selectivity by changing the angle θ and a ratio of the transmitted and reflected portions is a function of wavelength of output beam and the angle θ.

2. The system of claim 1, wherein the first photodetector is positioned in a lateral direction relative to the laser.

3. The optical system of claim 1, wherein an output face of the tunable laser is coplanar with a face of the first photodetector.

4. The optical system of claim 1, wherein an output face of the tunable laser is non-coplanar with a face of the first photodetector.

5. The optical system of claim 1, wherein the first photodetector is distanced from the tunable laser.

6. The system of claim 1, further comprising:
a second photodetector positioned adjacent to the first photodetector, wherein two different parts of the output beam are incident on the first and second photodetectors and a change in wavelength from the laser is converted to a difference in transmission detected by the first and second photodetectors.

7. The system of claim 6, further comprising:
a control loop coupled to the first and second photodetectors and the laser, the control loop providing a feedback of a difference signal generated by the first and second photodetectors in response to a change in wavelength of the laser.

8. The system of claim 7, wherein the system is programmable.

9. The system of claim 7, further comprising:
a control source coupled to the laser and the control loop, the control source providing wavelength stabilization of the laser in response to a change in wavelength of the laser.

10. The assembly of claim 6, wherein the laser, the first photodiode and the second photodiode form a monolithically integrated chip.

11. The assembly of claim 6, wherein the laser, the first photodiode and the second photodiode form an integral assembly.

12. The assembly of claim 1, wherein the laser and the first photodiode form a monolithically integrated chip.

13. The assembly of claim 1, wherein the wavelength selective filter is a Fabry-Perot etalon.

14. The assembly of claim 1, wherein the laser and the wavelength selective filter are positioned on a common substrate.

15. The assembly of claim 1, wherein the first photodiode is one photodiode included in an array of photodiodes.

16. The assembly of claim 15, wherein the laser and the array of photodiodes form a monolithically integrated chip.

17. The assembly of claim 1, wherein the laser is a semiconductor laser.

18. The assembly of claim 1, wherein the laser is an output face of a semiconductor laser.

19. The assembly of claim 1, wherein the angle of the wavelength selective filter is adjustable to provide wavelength tunability.

20. The assembly of claim 1, wherein the laser comprises:
a cantilever apparatus for tuning resonance wavelength of a Fabry-Perot cavity, the Fabry-Perot cavity including a bottom reflecting member and a top reflecting member.

21. The assembly of claim 20, wherein the Fabry-Perot cavity comprises:
an electrically responsive substrate;

a support block positioned on the electrically responsive substrate; and a cantilever structure including a base section resting on the support block, a deformable section extending above the electrically responsive substrate and creating an air gap between the deformable section and the electrically responsive substrate, and an active head positioned at a predetermined location on the deformable section and including at least a portion of the top reflecting member.

22. The assembly of claim 21, wherein the laser further comprises:

an electrical tuning contact disposed on the cantilever structure for applying a tuning voltage $V_t$ to produce a downward electrostatic force $F_d$ between the electrical tuning contact and the electrically responsive substrate, wherein the size of the air gap is altered and a resonant wavelength is tuned.

23. The assembly of claim 22, wherein the laser further comprises:

an oxidation layer disposed within one of the reflecting members, the oxidation layer having been partially oxidized so that a small aperture of unoxidized remains to provide optical and current confinement.

24. The assembly of claim 20, wherein the Fabry-Perot cavity comprises:

an electrically responsive substrate;

a support block positioned on the electrically responsive substrate; and a cantilever structure including a base section resting on the support block, a deformable section extending above the electrically responsive substrate and creating an air gap between the deformable section and the electrically responsive substrate, and an active head positioned at a predetermined location on the deformable section and including at least a portion of the top reflecting member.

25. The assembly of claim 24, wherein the laser catcher comprises:

a electrical tuning contact disposed on the cantilever structure for applying a tuning voltage $V_t$ to produce a downward electrostatic force $F_d$ between the electrical tuning contact and the electrically responsive substrate, wherein the size of the air gap is altered and a resonant wavelength is tuned.

26. The assembly of claim 25, wherein the laser further comprises:

an oxidation layer disposed within one of the reflecting members, the oxidation layer having been partially oxidized so that a small aperture of unoxidized remains to provide optical and current confinement.

27. A monitoring and control assembly for an optical system, comprising:

a tunable laser selected from a VCSEL or an edge emitter generating a divergent output beam along an optical axis, the laser including an active region with first and second opposing reflectors that define a laser gain cavity;

a collimating optical element positioned along the optical axis;

a pair of photodetectors each positioned outside of the laser gain cavity; and a wavelength selective filter including a Fabry-Perot Etalon with a distributed thickness to provide a positional dependence of a wavelength reflection or transmission of the filter and transmit or reflect the beam towards the pair of detectors.

28. The system of claim 27, further comprising:

a control loop coupled to the first and second photodetectors and the laser, the control loop providing a feedback of a difference signal generated by the first and second photodetectors in response to a change in wavelength of the laser.

29. The system of claim 28, wherein the system is programmable.

30. The system of claim 28, further comprising:

a control source coupled to the laser and the control loop, the control source providing wavelength stabilization of the laser in response to a change in wavelength of the laser.

31. The assembly of claim 27, wherein the first and second photodiodes are positioned on a common substrate.

32. The assembly of claim 27, wherein the laser is a semiconductor laser.

33. The assembly of claim 27, wherein the laser is an output face of a semiconductor laser.

34. The assembly of cl aim 27, wherein the laser comprises:

a cantilever apparatus for tuning resonance wavelength of a Fabry-Perot cavity, the Fabry-Perot cavity including a bottom reflecting member and a top reflecting member.

* * * * *